(12) United States Patent
Takano

(10) Patent No.: US 9,633,926 B2
(45) Date of Patent: Apr. 25, 2017

(54) SEMICONDUCTOR DEVICE AND MANUFACTURING METHOD OF SEMICONDUCTOR DEVICE

(71) Applicant: TOYOTA JIDOSHA KABUSHIKI KAISHA, Toyota-shi, Aichi-ken (JP)

(72) Inventor: Yuya Takano, Nishio (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 14/834,858

(22) Filed: Aug. 25, 2015

(65) Prior Publication Data
US 2016/0064304 A1    Mar. 3, 2016

(30) Foreign Application Priority Data
Sep. 2, 2014    (JP) .................... 2014-177932

(51) Int. Cl.
| | |
|---|---|
| *H05K 5/00* | (2006.01) |
| *H05K 7/00* | (2006.01) |
| *H01L 23/473* | (2006.01) |
| *H01L 25/11* | (2006.01) |
| *H01L 21/48* | (2006.01) |
| *H01L 23/40* | (2006.01) |
| *H01L 23/367* | (2006.01) |

(52) U.S. Cl.
CPC ........ *H01L 23/473* (2013.01); *H01L 21/4882* (2013.01); *H01L 23/40* (2013.01); *H01L 25/117* (2013.01); *H01L 23/3675* (2013.01); *H01L 2225/1076* (2013.01); *H01L 2225/1094* (2013.01); *H01L 2924/0002* (2013.01)

(58) Field of Classification Search
CPC ........... H05K 7/20845; H05K 7/20763; H05K 7/20872; H05K 7/20927; H01L 23/473
USPC .......................... 361/699, 688, 689, 698, 700
See application file for complete search history.

(56) References Cited

U.S. PATENT DOCUMENTS

| | | | | |
|---|---|---|---|---|
| 3,573,569 | A * | 4/1971 | Davis .................... | H01L 23/427 257/686 |
| 4,348,687 | A | 9/1982 | Keller et al. | |
| 8,531,840 | B2 * | 9/2013 | Tachibana ............. | H02M 7/003 361/688 |

(Continued)

FOREIGN PATENT DOCUMENTS

| | | |
|---|---|---|
| JP | S55-124254 A | 9/1980 |
| JP | H07-86500 A | 3/1995 |

(Continued)

*Primary Examiner* — Anthony Haughton
(74) *Attorney, Agent, or Firm* — Oliff PLC

(57) ABSTRACT

A semiconductor device includes a stacked unit having a semiconductor module, a first cooler having a first opening and a first coolant flow path that is connected to the first opening, and a second cooler that has a second opening and a second coolant flow path that is connected to the second opening, and being formed by the first cooler and the second cooler sandwiching the semiconductor module and being stacked such that the first opening and the second opening face each other; a seal member that is arranged between the first opening and the second opening that are adjacent in a stacking direction, and that connect the first opening and the second opening; and a winding member that keeps pressure applied to the stacked unit in the stacking direction by being wound around the stacked unit.

3 Claims, 9 Drawing Sheets

(56) References Cited

U.S. PATENT DOCUMENTS

| | | | | |
|---|---|---|---|---|
| 8,587,943 B2* | 11/2013 | Barina | ............... | H01L 23/427 |
| | | | | 165/104.33 |
| 9,184,670 B2* | 11/2015 | Matsuno | ............ | H02M 7/003 |
| 9,258,882 B2* | 2/2016 | Bettoni | ............. | H05K 1/0206 |
| 9,437,523 B2* | 9/2016 | Joshi | ................ | H01L 23/4735 |
| 2006/0096299 A1* | 5/2006 | Mamitsu | ............ | H01L 23/473 |
| | | | | 62/3.2 |
| 2006/0219396 A1* | 10/2006 | Abei | .................. | F28D 1/0333 |
| | | | | 165/164 |
| 2008/0253085 A1* | 10/2008 | Soffer | .................... | G06F 1/18 |
| | | | | 361/679.4 |
| 2009/0057879 A1* | 3/2009 | Garrou | ............... | H01L 23/473 |
| | | | | 257/713 |
| 2012/0212907 A1* | 8/2012 | Dede | ............... | H01L 23/4735 |
| | | | | 361/702 |
| 2012/0250252 A1* | 10/2012 | Iguchi | ............. | H05K 7/20927 |
| | | | | 361/689 |
| 2015/0189790 A1* | 7/2015 | Tachibana | ....... | H05K 7/20927 |
| | | | | 361/699 |

FOREIGN PATENT DOCUMENTS

| | | |
|---|---|---|
| JP | H11-284125 A | 10/1999 |
| JP | 2000-058747 A | 2/2000 |
| JP | 2004-335777 A | 11/2004 |
| JP | 2007-166820 A | 6/2007 |
| JP | 2014-120720 A | 6/2014 |
| WO | 2012/143060 A1 | 10/2012 |

* cited by examiner

SEMICONDUCTOR DEVICE AND MANUFACTURING METHOD OF SEMICONDUCTOR DEVICE

INCORPORATION BY REFERENCE

The disclosure of Japanese Patent Application No. 2014-177932 filed on Sep. 2, 2014 including the specification, drawings and abstract is incorporated herein by reference in its entirety.

BACKGROUND OF THE INVENTION

1. Field of the Invention

The invention relates to a semiconductor device and a manufacturing method of a semiconductor device.

2. Description of Related Art

Such technology is described in Japanese Patent Application Publication No. 2004-335777 (JP 2004-335777 A), which describes a flat semiconductor stack that includes a stacked body formed by alternately stacking a plurality of semiconductor elements and heat sinks on the same axis, two pressure support plates that apply pressure to the stacked body from both ends in the axial direction, a plurality of stud bolts that connect and support the two pressure support plates, and plate springs arranged between the stacked body and the pressure support plates.

However, with the structure described in JP 2004-335777 A, in order to keep pressure applied to the stacked body in the axial direction, the plurality of stud bolts are unable to be removed, and as a result the stack ends up being large.

SUMMARY OF THE INVENTION

A first aspect of the invention relates to a semiconductor device that includes i) a stacked unit including a semiconductor module, a first cooler having a first opening and a first coolant flow path that is connected to the first opening, and a second cooler having a second opening and a second coolant flow path that is connected to the second opening, the stacked unit being formed by the first cooler and the second cooler sandwiching the semiconductor module, and the stacked unit being stacked such that the first opening and the second opening face each other; ii) a seal member being arranged between the first opening and the second opening that are adjacent in a stacking direction, and the seal member connecting the first opening and the second opening; and iii) a winding member keeping pressure applied to the stacked unit in the stacking direction by being wound around the stacked unit.

A second aspect of the invention relates to a manufacturing method of a semiconductor device, which includes i) forming a stacked unit in which a semiconductor module is sandwiched between a first cooler having a first opening and a first coolant flow path that is connected to the first opening, and a second cooler that has a second opening and a second coolant flow path that is connected to the second opening, and the first cooler and the second cooler are stacked such that the first opening and the second opening face each other; and ii) applying pressure to the stacked unit in the stacking direction while a seal member that connects the first opening and the second opening together is arranged between the first opening and the second opening that are adjacent in the stacking direction, and keeping pressure applied to the stacked unit in the stacking direction by winding a winding member around the stacked unit while the pressure is being applied to the stacked unit.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS (First example embodiment) Hereinafter, a semiconductor stack 1 will be described with reference to FIGS. 1 to 6. The semiconductor stack 1 is a semiconductor device that functions as a power converter such as an inverter or a converter or the like.

Figure 1:
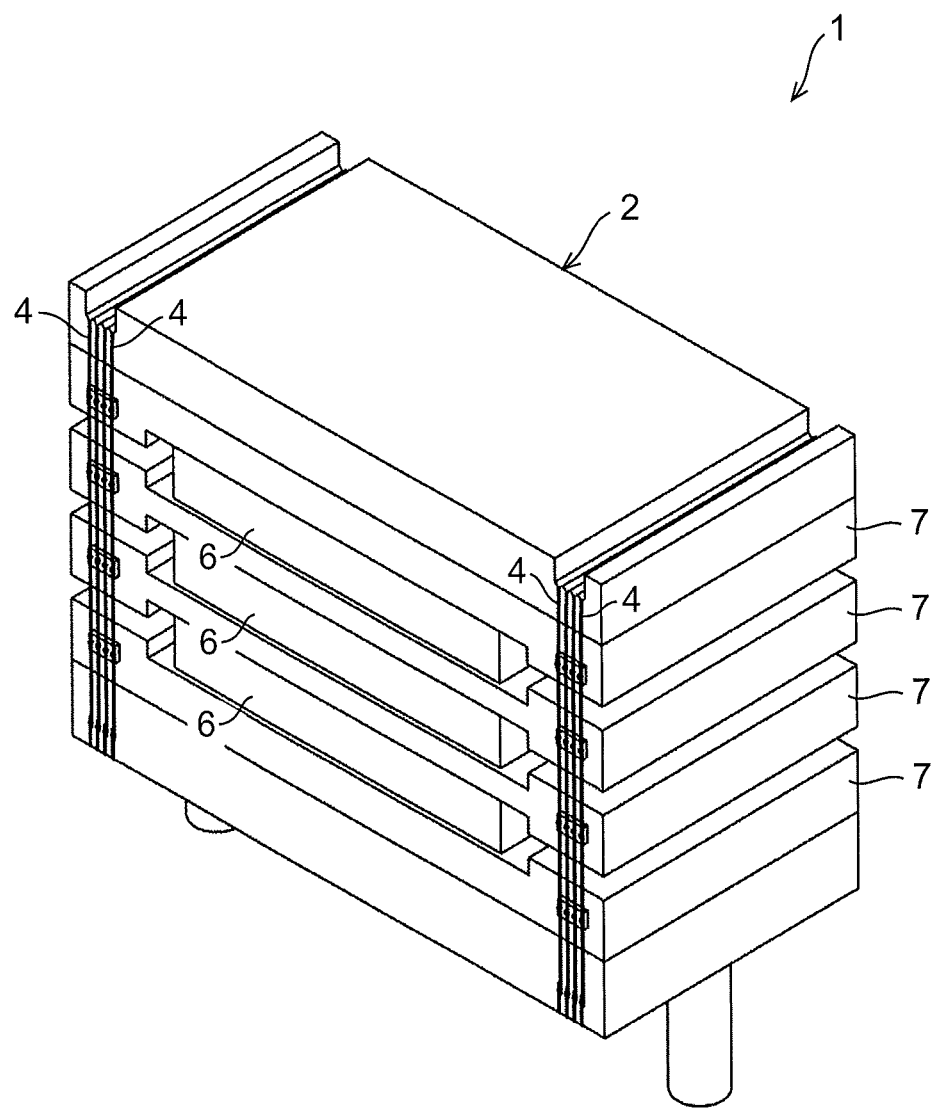
FIG. 1 is a perspective view of a semiconductor stack according to a first example embodiment of the invention.
Figure 2:
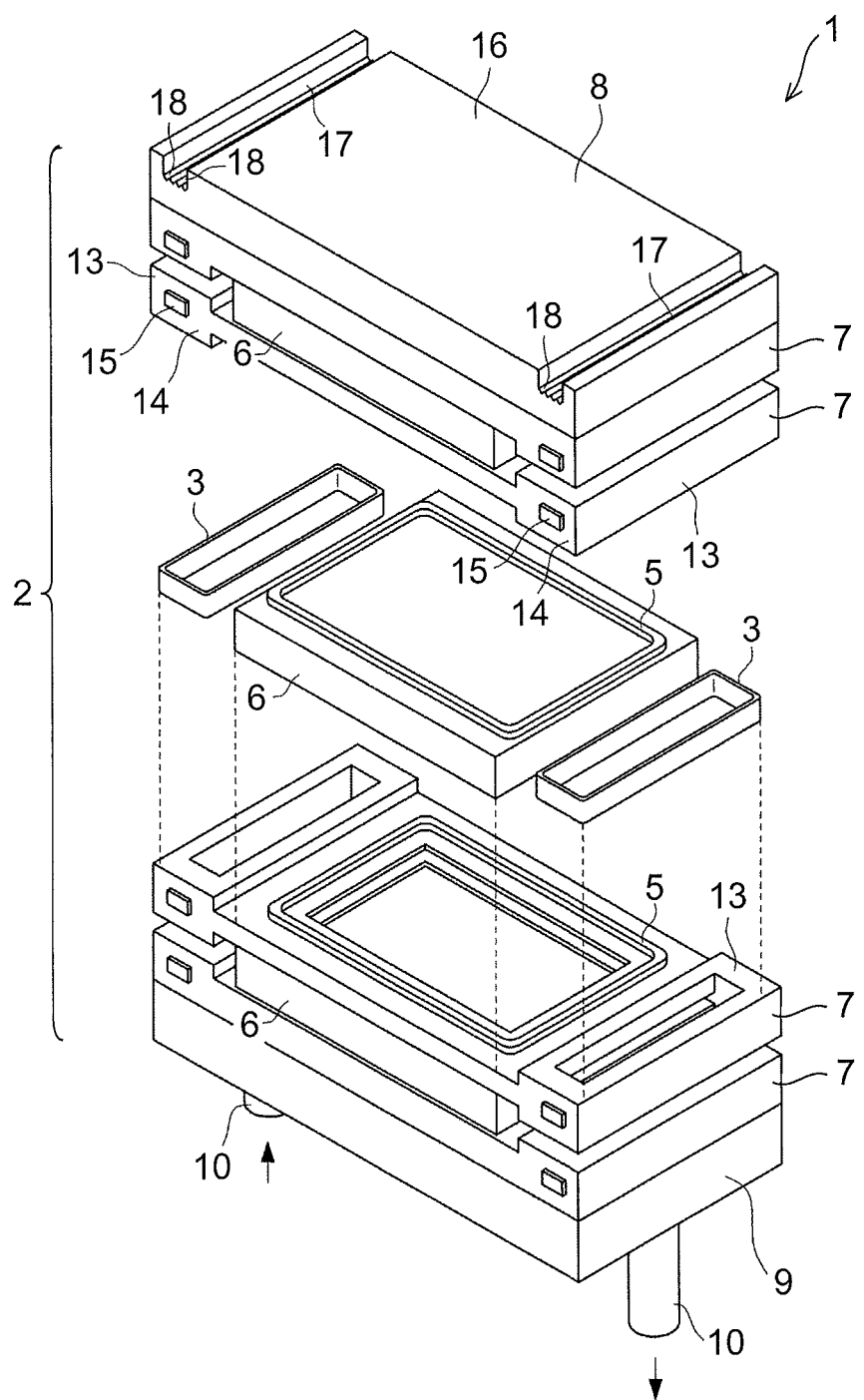
FIG. 2 is an exploded perspective view of the semiconductor stack according to the first example embodiment.
Figure 3:
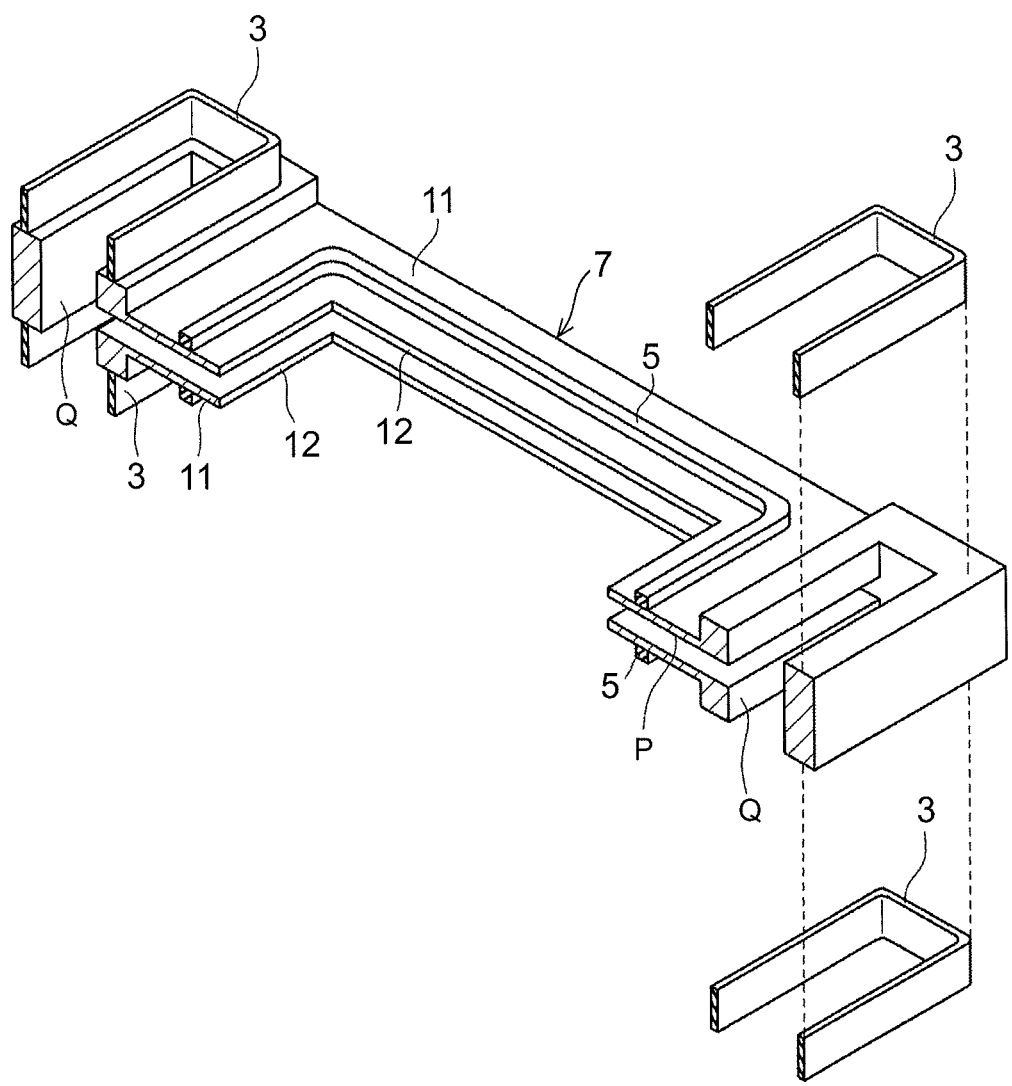
FIG. 3 is a partial cutaway perspective view of a cooler according to the first example embodiment.
Figure 4:
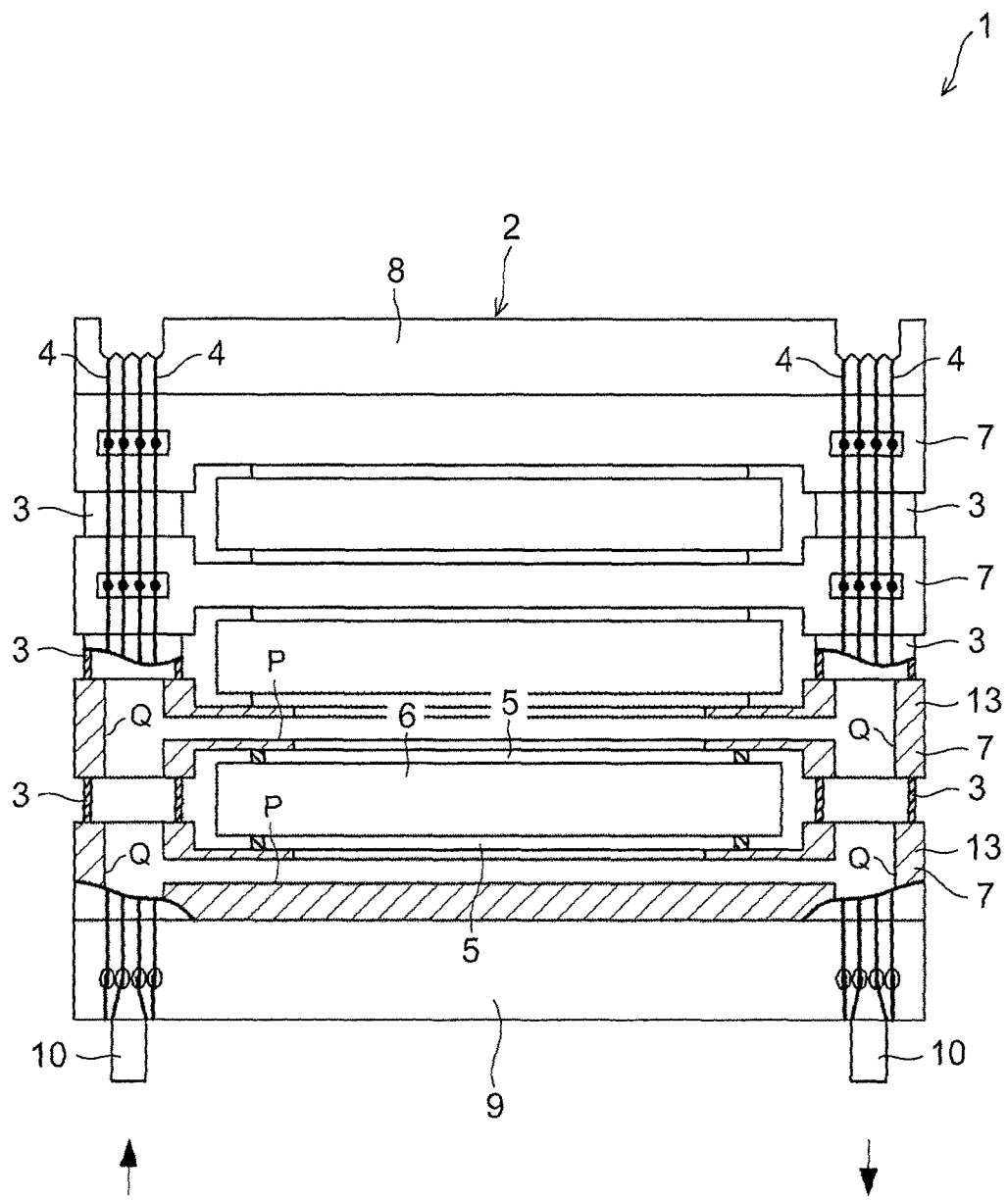
FIG. 4 is a partial cutaway front view of the semiconductor stack according to the first example embodiment.
Figure 5:
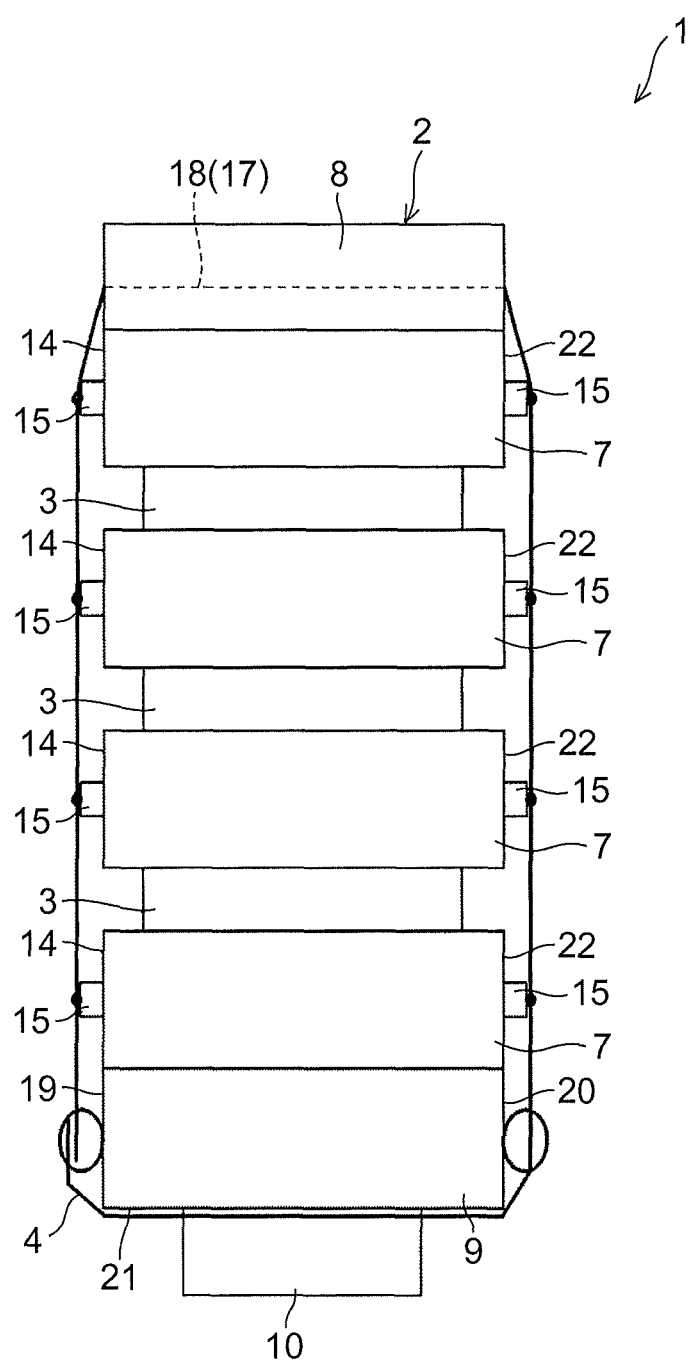
FIG. 5 is a side view of the semiconductor stack according to the first example embodiment.
Figure 6:
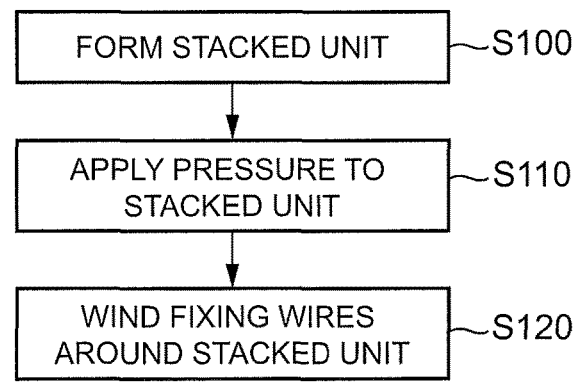
FIG. 6 is a view of the manufacturing flow of the semiconductor device according to the first example embodiment.

FIG. 1 is a perspective view of the semiconductor stack 1, FIG. 2 is an exploded perspective view of the semiconductor stack 1, FIG. 3 is a partial cutaway perspective view of a cooler, FIG. 4 is a partial cutaway front view of the semiconductor stack 1, and FIG. 5 is a side view of the semiconductor stack 1. As shown in FIGS. 1 and 4, the semiconductor stack 1 includes a stacked unit 2, six connecting seal members 3 (seal members), eight fixing wires 4 (winding members, wire-like members), and six card seal members 5.

As shown in FIGS. 1, 2, and 4, the stacked unit 2 is formed by alternately stacking three semiconductor cards 6 (semiconductor modules), and four coolers 7. As shown in FIG. 2, the stacked unit 2 also includes a top plate 8, a bottom plate 9, and two coolant supply and discharge conduits 10. The top plate 8 is arranged above the top cooler 7. The bottom plate 9 is arranged below the bottom cooler 7. The two coolant supply and discharge conduits 10 are arranged extending downward from the bottom plate 9.

Each semiconductor card 6 is formed in a flat shape. The semiconductor card 6 is a semiconductor package that houses a power semiconductor element such as a MOSFET, for example.

Each cooler 7 is made of resin such as PPS, for example, and is formed in a hollow box-shape, as shown in FIGS. 3 and 4. A card cooling flow path P for coolant such as cooling water, for example, is formed inside each cooler 7. As shown in FIG. 3, each cooler 7 has two dividing plates 11 that sandwich the card cooling flow path P in the stacking direction. A card cooling hole 12 is formed in each dividing plate 11. Also, a coolant supply and discharge flow path Q that extends in the stacking direction is formed on each of two end portions 13 in the width direction of each cooler 7. Both of these coolant supply and discharge flow paths Q are connected to the card cooling flow path P. A welding piece 15 made of SUS is provided by insert-forming on a front surface 14 of each of the two end portions 13 of each cooler 7, as shown in FIG. 2. A welding piece 15 made of SUS is similarly provided by insert-forming on a back surface 22 of each of the two end portions 13 of each cooler 7 as well, as shown in FIG. 5.

As shown in FIG. 2, the top plate 8 is arranged on top of the stacked unit 2. The top plate 8 is made of metal such as Al, for example. Two wire accommodating grooves 17 (accommodating grooves) are formed in an upper surface 16 of the top plate 8. The wire accommodating grooves 17 are formed in positions directly above the end portions 13 of each cooler 7 when viewed from these end portions 13. The wire accommodating grooves 17 are formed extending in the front-rear direction of the stacked unit 2. Each wire accommodating groove 17 has four small grooves 18 that are able to accommodate the four fixing wires 4 individually. The four small grooves 18 are formed extending in the front-rear direction of the stacked unit 2.

The bottom plate 9 is arranged on the bottom of the stacked unit 2. The bottom plate 9 is made of metal such as SUS (stainless steel), for example.

The two coolant supply and discharge conduits 10 are designed to supply coolant to one of the coolant supply and discharge flow paths Q of the bottom cooler 7, and discharge coolant from the other coolant supply and discharge flow path Q of the bottom cooler 7.

As shown in FIG. 4, the connecting seal members 3 are seal members for connecting together the card cooling flow paths P of two coolers 7 that are adjacent in the stacking direction. More specifically, each connecting seal member 3 is arranged between the end portions 13 of two coolers 7 that face each other in the stacking direction, and connect the coolant supply and discharge flow paths Q inside of the end portions 13 of the two cooler 7 that face each other in the stacking direction.

As shown in FIGS. 2 and 3, the card seal members 5 are seal members for preventing coolant from leaking outside when coolant that flows through the card cooling flow path P directly contacts the semiconductor card 6 through the card cooling hole 12 and performs heat exchange.

As shown in FIGS. 1, 4, and 5, the fixing wires 4 are wound around the stacked unit 2 so as to keep pressure applied to the stacked unit 2 in the stacking direction of thereof. When pressure is applied in the stacking direction to the stacked unit 2, the connecting seal members 3 closely contact the end portions 13 of the coolers 7, and the card seal members 5 closely contact the semiconductor card 6 and the cooler 7. As shown in FIG. 5, each of the fixing wires 4 is wound once around the stacked unit 2, running from a front surface 19 of the bottom plate 9, through the small grooves 18 in the wire accommodating groove 17, along a back surface 20 of the bottom plate 9, along a bottom surface 21 of the bottom plate 9, and then back to the front surface 19 of the bottom plate 9, in this order. The two end portions of the fixing wires 4 are fixed to the stacked unit 2 by being welded to the front surface 19 of the bottom plate 9, for example. Also, the fixing wires 4 are fixed by welding to the welding pieces 15 provided on each cooler 7. As a result, when the fixing wires 4 are in a state wound around the stacked unit 2, the relative positional relationship between the plurality of coolers 7 is stable. Also, accommodating the fixing wires 4 in the small grooves 18 of the wire accommodating groove 17 effectively inhibits the fixing wires 4 from moving or becoming offset in a direction orthogonal to the length direction of the fixing wires 4. Four of the fixing wires 4 are accommodated in one wire accommodating groove 17, and the remaining four fixing wires 4 are accommodated in the other wire accommodating groove 17.

Next, a manufacturing method of the semiconductor stack 1 will be described.

First, as shown in FIGS. 2 and 3, the stacked unit 2 is formed (S100). More specifically, three semiconductor cards 6 and four coolers 7 are alternately stacked. Then the top plate 8 is attached to the top cooler 7 and the bottom plate 9 is attached to the bottom cooler 7, and the two coolant supply and discharge conduits 10 are attached to the bottom plate 9. At this time, the card seal members 5 are arranged between the semiconductor cards 6 and the coolers 7. Similarly, the connecting seal members 3 are arranged between the end portions 13 of two coolers 7 that face each other in the stacking direction.

Next, pressure is applied to the stacked unit 2 in the stacking direction using a pressure applying device, not shown (S110). With this pressure, the connecting seal members 3 closely contact the end portions 13 of the cooler 7, and the card cooling flow paths P of two coolers 7 that are adjacent in the stacking direction are become connected in parallel. Also, simultaneously, the card seal members 5 closely contact the semiconductor cards 6 and the coolers 7.

Lastly, while keeping the pressure applied, the fixing wires 4 are wound around the stacked unit 2, as shown in FIGS. 1 and 5 (S120). As a result of these fixing wires 4 being wound around the stacked unit 2, pressure remains applied to the stacked unit 2 in the stacking direction even after the pressure applying device stops applying pressure to the stacked unit 2.

Next, a method for using the semiconductor stack 1 will be described. As shown in FIG. 4, when coolant is supplied to the coolant supply and discharge conduit 10 on the left side, this coolant is supplied to the card cooling flow path P of each cooler 7 via the coolant supply and discharge flow path Q on the left side of each cooler 7. The coolant supplied to the card cooling flow path P of each cooler 7 absorbs heat by flowing through the card cooling flow path P, and is discharged to the coolant supply and discharge flow path Q on the right side of each cooler 7. Also, the coolant that has absorbed heat is discharged to the outside from the coolant supply and discharge conduit 10 on the right side. As a result, operating heat generated by the semiconductor cards 6 is recovered by the coolant, so the semiconductor cards 6 are able to operate at a suitable temperature.

Above, the first example embodiment has been described. This example embodiment has the following characteristics.

(1) The semiconductor stack 1 (semiconductor device) includes i) a stacked unit 2 which includes a plurality of semiconductor cards 6 (semiconductor modules) and a plurality of coolers 7 that have card cooling flow paths P (flow paths) for a coolant, and which is formed by alternately stacking the plurality of semiconductor cards 6 and the plurality of coolers 7 together, ii) a connecting seal member 3 (a seal member) which is arranged between two coolers 7 that are adjacent in the stacking direction, and which connects the card cooling flow paths P of two coolers 7 that are adjacent in the stacking direction together, and iii) fixing wires 4 (winding members) that keep pressure applied to the stacked unit 2 in the stacking direction by being wound around the stacked unit 2. According to this structure, the stud bolts in JP 2004-335777 A described above are able to be omitted, thus enabling the semiconductor stack 1 to be made smaller, without losing the function of keeping pressure applied to the stacked unit 2 in the stacking direction.

(2) Also, the wire accommodating grooves 17 that are able to accommodate the fixing wires 4 are formed, extending in the length direction of the fixing wires 4, in the stacked unit 2. According to this structure, movement of the fixing wires 4 in a direction orthogonal to the length direction of the fixing wires 4 is able to be inhibited.

Further, more specifically, the fixing wires 4 are accommodated in the wire accommodating grooves 17.

(3) Also, the fixing wires 4 are welded to the plurality of coolers 7. According to this structure, the relative positional relationship between the plurality of coolers 7 is stable.

(5) The semiconductor stack 1 is manufactured by forming the stacked unit 2 by alternately stacking together the plurality of semiconductor cards 6 and the plurality of coolers 7 having the card cooling flow path P for coolant (S100), applying pressure to the stacked unit 2 in the stacking direction while the connecting seal members 3 that connect the card cooling flow paths P of two coolers 7 that are adjacent in the stacking direction are arranged between two coolers 7 that are adjacent in the stacking direction (S110), and keeping pressure applied to the stacked unit 2 in the stacking direction by winding the fixing wires 4 around the stacked unit 2 while the pressure is being applied to the stacked unit 2 (S120). According to this method, the stud bolts described above are able to be omitted, thus enabling the semiconductor stack 1 to be made smaller, without losing the function of keeping pressure applied to the stacked unit 2 in the stacking direction.

Figure 7:
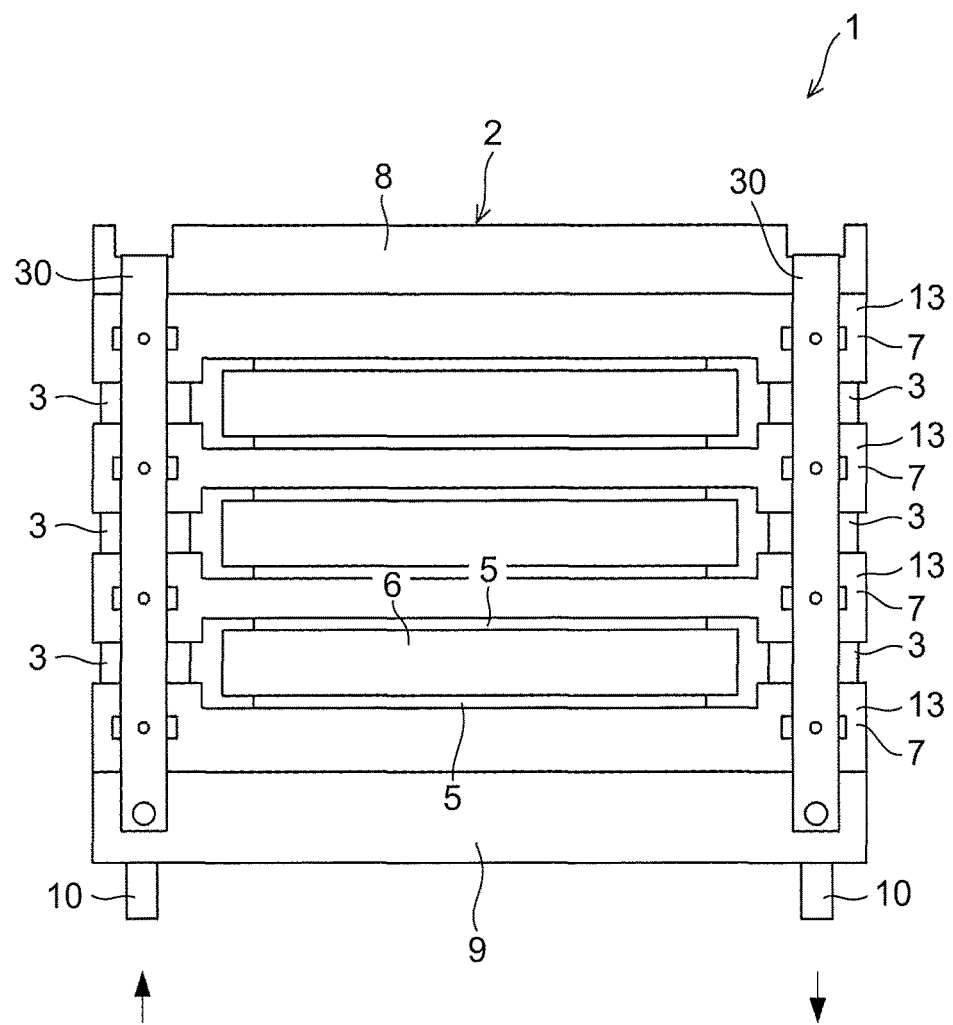
FIG. 7 is a front view of a semiconductor device according to a second example embodiment of the invention.

(Second example embodiment) Next, a second example embodiment of the invention will be described with reference to FIGS. 7 and 8. Hereinafter, mainly the differences between this example embodiment and the first example embodiment described above will be described, and redundant descriptions will be omitted as appropriate.

In the first example embodiment described above, eight of the fixing wires 4 are used to keep pressure applied to the stacked unit 2 in the stacking direction. In contrast, in this example embodiment, two cooler fixing plates 30 (bands, band-like members, plates) are used instead of the eight fixing wires 4. These cooler fixing plates 30 are made of metal such as SUS, for example, and preferably have a thickness of no more than 20 mm.

Figure 8:
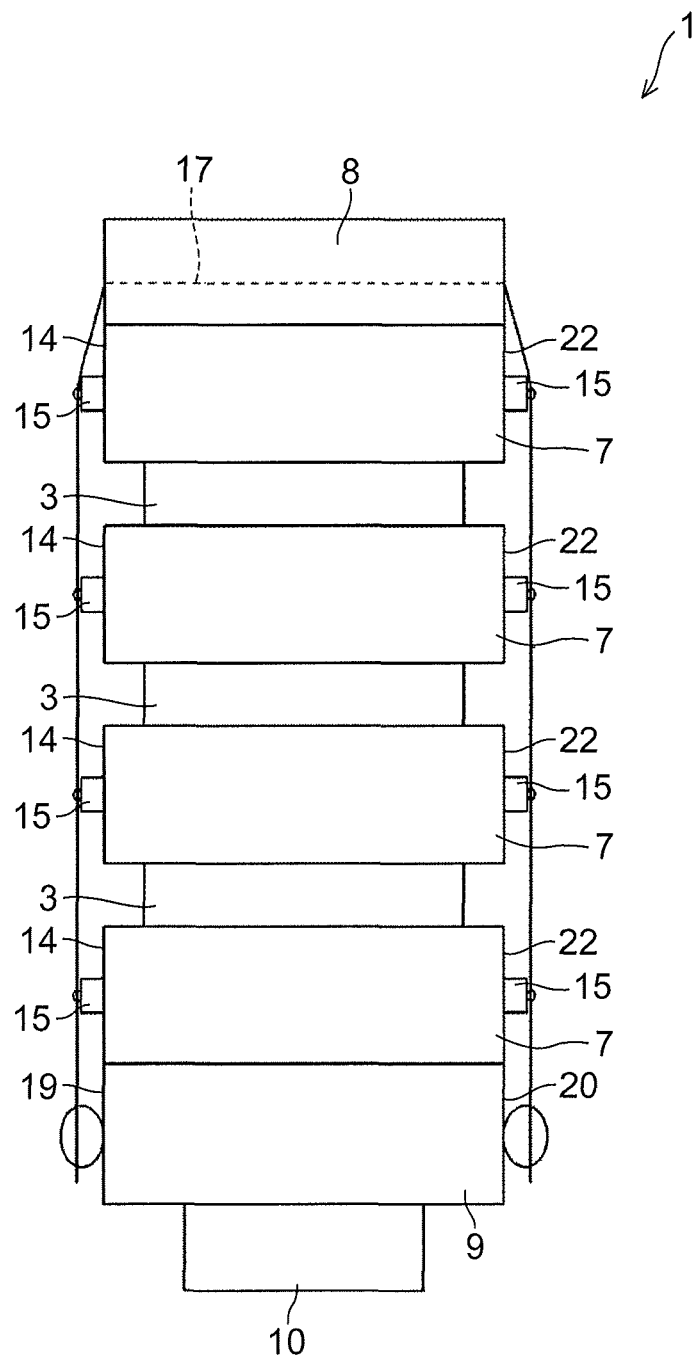
FIG. 8 is a side view of the semiconductor device according to the second example embodiment.

As shown in FIG. 8, the cooler fixing plates 30 are wound around the stacked unit 2 so as to run along the front surface 19 of the bottom plate 9, the wire accommodating grooves 17 in the top plate 8, and the back surface 20 of the bottom plate 9, in this order. An end portion of each cooler fixing plate 30 is fixed to the back surface 20 of the bottom plate 9 by welding. Also, each cooler fixing plate 30 is fixed to the welding pieces 15 provided on each cooler 7 by welding. As a result, when the cooler fixing plates 30 are in a state wound around the stacked unit 2, the relative positional relationship between the plurality of coolers 7 is stable. Also, having the cooler fixing plates 30 accommodated in the wire accommodating grooves 17 effectively inhibits the cooler fixing plates 30 from moving or becoming offset in a direction orthogonal to the length direction of the cooler fixing plates 30.

(Third example embodiment) Next, a third example embodiment of the invention will be described with reference to FIGS. 9 and 10. Hereinafter, mainly the differences between this example embodiment and the second example embodiment described above will be described, and redundant descriptions will be omitted as appropriate.

Figure 9:
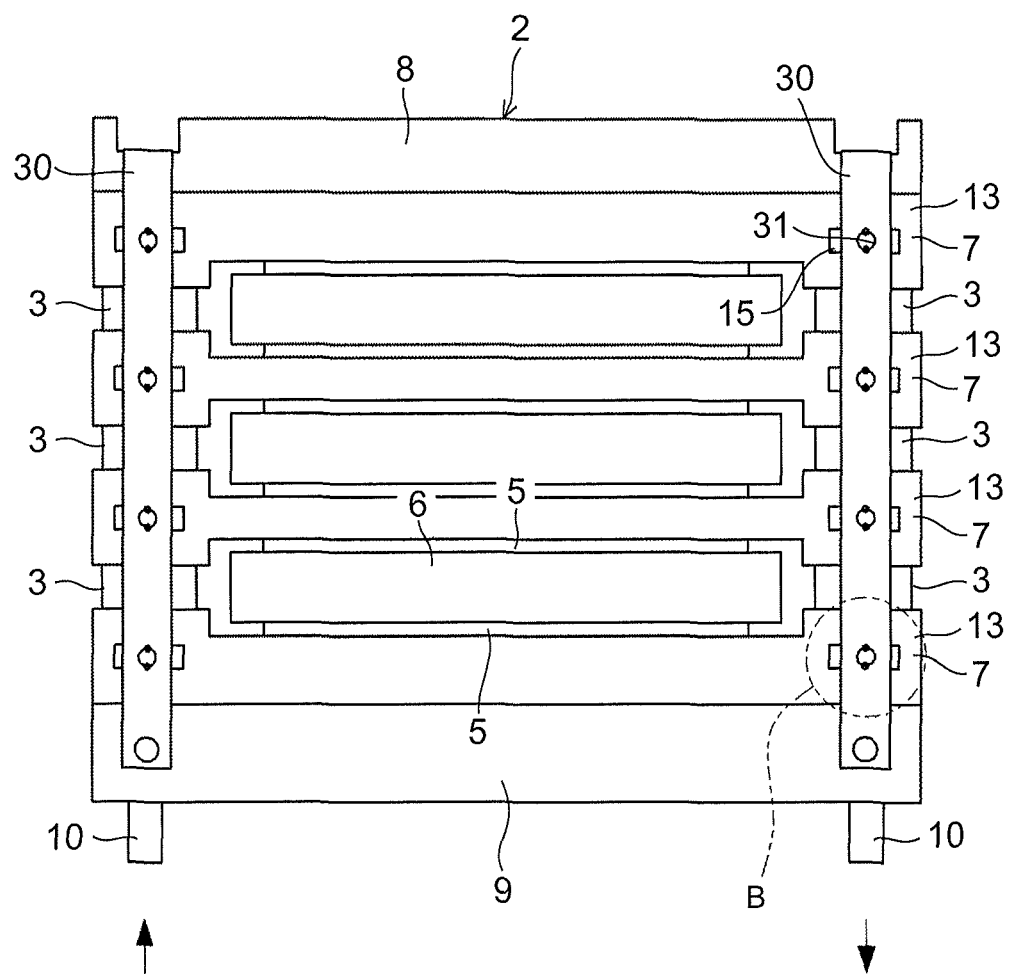
FIG. 9 is a front view of a semiconductor stack according to a third example embodiment of the invention.
Figure 10:
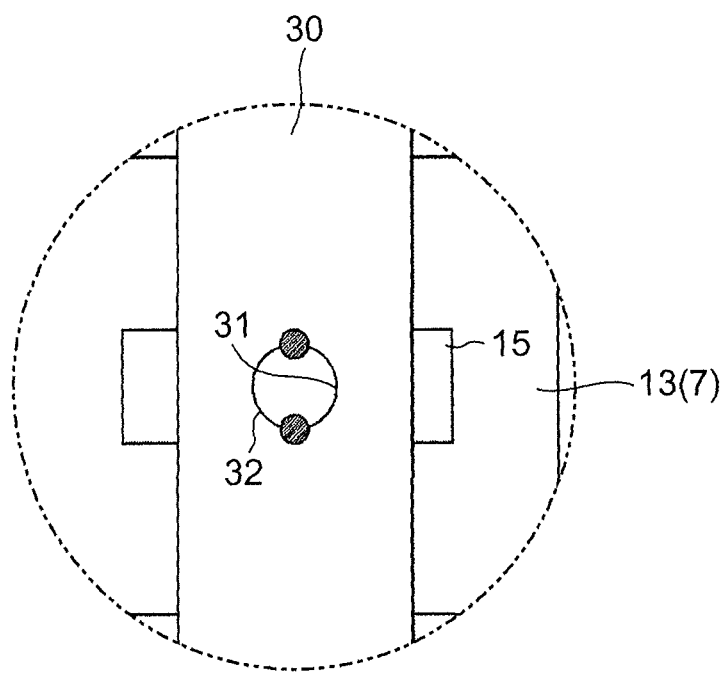
FIG. 10 is an enlarged view of portion B in FIG. 9 according to the third example embodiment.

As shown in FIG. 9, a plurality of welding holes 31 are formed in each cooler fixing plate 30. More specifically, the welding holes 31 are formed in positions facing the welding pieces 15 of the coolers 7. Then, the cooler fixing plates 30 are welded to the welding pieces 15 of the coolers 7, at a peripheral edge 32 of each welding hole 31. Welding is performed in two locations on one peripheral edge 32. According to this structure, the cooler fixing plates 30 are able to be efficiently fixed to the coolers 7.

(4) That is, the semiconductor stack 1 has the metal cooler fixing plates 30 (bands) instead of the fixing wires 4. The plurality of welding holes 31 are formed in positions facing the plurality of coolers 7, in the cooler fixing plates 30. The cooler fixing plates 30 are welded to the plurality of coolers 7, at the peripheral edges 32 of the plurality of welding holes 31. According to this structure, the cooler fixing plates 30 are able to be efficiently fixed to the plurality of coolers 7.

What is claimed is:

1. A semiconductor device comprising:
   a stacked unit including a semiconductor module, a first cooler having a first opening and a first coolant flow path that is connected to the first opening, and a second cooler having a second opening and a second coolant flow path that is connected to the second opening, the stacked unit being formed by the first cooler and the second cooler sandwiching the semiconductor module, and the stacked unit being stacked such that the first opening and the second opening face each other;
   a seal member being arranged between the first opening and the second opening that are adjacent in a stacking direction, and the seal member connecting the first opening and the second opening; and
   a winding member keeping pressure applied to the stacked unit in the stacking direction by being wound around the stacked unit, wherein
   the winding member is welded to the plurality of coolers, and
   the winding member is a metal band, a plurality of welding holes are formed in positions facing the plurality of coolers, in the band, and the band is welded to the plurality of coolers, at peripheral edges of the plurality of welding holes.

2. The semiconductor device according to claim 1, wherein an accommodating groove capable of accommodating the winding member is formed, extending in a length direction of the winding member, in the stacked unit.

3. A manufacturing method of a semiconductor device, comprising:
   forming a stacked unit in which a semiconductor module is sandwiched between a first cooler having a first opening and a first coolant flow path that is connected to the first opening, and a second cooler that has a second opening and a second coolant flow path that is connected to the second opening, and the first cooler and the second cooler are stacked such that the first opening and the second opening face each other;
   applying pressure to the stacked unit in the stacking direction while a seal member that connects the first opening and the second opening together is arranged between the first opening and the second opening that are adjacent in the stacking direction, and keeping pressure applied to the stacked unit in the stacking direction by winding a winding member around the stacked unit while the pressure is being applied to the stacked unit;
   welding the winding member to the plurality of coolers, the winding member being a metal band;

forming a plurality of welding holes in positions facing the plurality of coolers, in the band; and welding the band to the plurality of coolers, at peripheral edges of the plurality of welding holes.

* * * * *